US009349489B2

(12) United States Patent
Desireddi et al.

(10) Patent No.: US 9,349,489 B2
(45) Date of Patent: *May 24, 2016

(54) SYSTEMS AND METHODS TO UPDATE REFERENCE VOLTAGES IN RESPONSE TO DATA RETENTION IN NON-VOLATILE MEMORY

(71) Applicant: SANDISK TECHNOLOGIES INC., Plano, TX (US)

(72) Inventors: Sateesh Desireddi, Andhra Pradesh (IN); Jayaprakash Naradasi, Bangalore (IN); Anand Venkitachalam, Bangalore (IN); Manuel Antonio D'Abreu, El Dorado Hills, CA (US); Stephen Skala, Fremont, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 291 days.

This patent is subject to a terminal disclaimer.

(21) Appl. No.: 13/771,894

(22) Filed: Feb. 20, 2013

(65) Prior Publication Data

US 2014/0201580 A1 Jul. 17, 2014

(30) Foreign Application Priority Data

Jan. 11, 2013 (IN) ............................ 178/CHE/2013

(51) Int. Cl.

| | |
|---|---|
| ***G11C 29/00*** | (2006.01) |
| ***G11C 29/50*** | (2006.01) |
| ***G06F 12/02*** | (2006.01) |
| ***G11C 11/56*** | (2006.01) |
| ***G11C 16/26*** | (2006.01) |
| ***G11C 16/34*** | (2006.01) |

(52) U.S. Cl.
CPC ...... *G11C 29/50004* (2013.01); *G06F 12/0246* (2013.01); *G11C 11/5642* (2013.01); *G11C 16/26* (2013.01); *G11C 16/3495* (2013.01)

(58) Field of Classification Search
USPC ........................................................ 714/721
See application file for complete search history.

(56) References Cited

U.S. PATENT DOCUMENTS

| | | | | |
|---|---|---|---|---|
| 7,738,296 | B2 | 6/2010 | Lin | |
| 7,903,468 | B2 | 3/2011 | Litsyn et al. | |
| 7,941,590 | B2 | 5/2011 | Yang et al. | |
| 7,954,037 | B2 | 5/2011 | Lasser et al. | |
| 8,125,827 | B2 | 2/2012 | Park | |
| 8,164,961 | B2 | 4/2012 | Honma | |
| 8,576,621 | B2 * | 11/2013 | Kang | 365/185.03 |

(Continued)

OTHER PUBLICATIONS

Restriction Requirement mailed Nov. 21, 2014 in U.S. Appl. No. 13/860,777, 7 pages.

(Continued)

*Primary Examiner* — April Y Blair
*Assistant Examiner* — Thien D Nguyen
(74) *Attorney, Agent, or Firm* — Toler Law Group, PC

(57) ABSTRACT

A data storage device includes non-volatile memory and a controller. The controller is configured to, at a first time, determine a first count of storage elements having threshold voltages within a voltage range that corresponds to a first reference voltage. The controller is further configured to, at a second time, determine a second count of storage elements having threshold voltages within the voltage range. The controller is further configured to calculate an updated first reference voltage at least partially based on the first reference voltage, the first count, and the second count.

23 Claims, 4 Drawing Sheets

(56) References Cited

U.S. PATENT DOCUMENTS

| | | | | |
|---|---|---|---|---|
| 8,621,266 | B2 | 12/2013 | Kang et al. | |
| 2008/0092026 | A1 | 4/2008 | Brandman et al. | |
| 2008/0106936 | A1 | 5/2008 | Yang et al. | |
| 2009/0003073 | A1 | 1/2009 | Rizel et al. | |
| 2009/0300465 | A1 | 12/2009 | Wu et al. | |
| 2009/0307414 | A1 | 12/2009 | Sukegawa et al. | |
| 2009/0310404 | A1* | 12/2009 | Cho | G11C 7/06 365/185.2 |
| 2010/0002506 | A1 | 1/2010 | Cho et al. | |
| 2010/0064200 | A1 | 3/2010 | Choi et al. | |
| 2011/0170349 | A1* | 7/2011 | Avraham | G11C 11/5621 365/185.09 |
| 2011/0246859 | A1 | 10/2011 | Haratsch et al. | |
| 2012/0075932 | A1* | 3/2012 | Moschiano | G11C 11/5628 365/185.19 |
| 2012/0140560 | A1 | 6/2012 | Yang | |
| 2013/0007543 | A1* | 1/2013 | Goss et al. | 714/718 |
| 2013/0219108 | A1 | 8/2013 | Yang | |

OTHER PUBLICATIONS

International Search Report and Written Opinion of the International Searching Authority for International Application No. PCT/US2014/010750, mailed May 8, 2014, 8 pages.

Desireddi, Sateesh et al. "Systems and Methods to Update Reference Voltages of Non-Volatile Memory," U.S. Appl. No. 13/860,777, filed Apr. 11, 2013, 35 pages.

Kang, Wang et al. "Improving Flash Memory Reliability with Dynamic Thresholds: Signal Processing and Coding Schemes," 2012 7th International ICST Conference on Communications and Networking in China (CHINACOM), Aug. 8-10, 2012, IEEE, pp. 161-166.

Non-Final Office Action mailed Feb. 20, 2015 in U.S. Appl. No. 13/860,777, 10 pages.

International Preliminary Report on Patentability for International Application No. PCT/US2014/10750, issued Jul. 14, 2015, 5 pages.

Notice of Allowance and Fee(s) Due mailed Jul. 23, 2015 in U.S. Appl. No. 13/860,777, 8 pages.

* cited by examiner

SYSTEMS AND METHODS TO UPDATE REFERENCE VOLTAGES IN RESPONSE TO DATA RETENTION IN NON-VOLATILE MEMORY

CLAIM OF PRIORITY

The present application claims priority from Indian Patent Application No. 178/CHE/2013 filed on Jan. 11, 2013, which is incorporated herein in its entirety.

FIELD OF THE DISCLOSURE

The present disclosure is generally related to updating reference voltages in a data storage device.

BACKGROUND

Non-volatile data storage devices, such as universal serial bus (USB) flash memory devices or removable storage cards, have allowed for increased portability of data and software applications. Flash memory devices can enhance data storage density by storing multiple bits in each flash memory cell. For example, Multi-Level Cell (MLC) flash memory devices can provide increased storage density by storing 3 bits per cell, 4 bits per cell, or more.

Storing multiple bits of information in a single flash memory cell typically includes mapping sequences of bits to states of the flash memory cell. For example, a first sequence of bits "110" may correspond to a first state of a flash memory cell and a second sequence of bits "010" may correspond to a second state of the flash memory cell. After determining that a sequence of bits is to be stored into a particular flash memory cell, the particular flash memory cell may be programmed to a state (e.g., by setting a threshold voltage) that corresponds to the sequence of bits.

Once memory cells in a data storage device have been programmed, data may be read from the memory cells by sensing the programmed state of each memory cell by comparing the cell threshold voltage to one or more reference voltages. However, the sensed programming states can sometimes vary from the written programmed states due to one or more factors, such as data retention and program disturb conditions.

SUMMARY

Reference voltages used to read stored data may be updated based on changes of threshold voltages of storage elements that store the data. Updated reference voltages may be calculated based on a first count of storage elements that have a threshold voltage within a voltage range at a first time and a second count of storage elements that have a threshold voltage within the voltage range at a second time. The first count and the second count may be used to model a histogram curve before and after threshold voltage shifting has occurred. A relative shift of the histogram curve may be calculated and used to update corresponding reference voltages. The updated reference voltages may enable more accurate reading of the data from the storage elements after threshold voltage shifting has occurred between the first time and the second time

DETAILED DESCRIPTION

Figure 1:
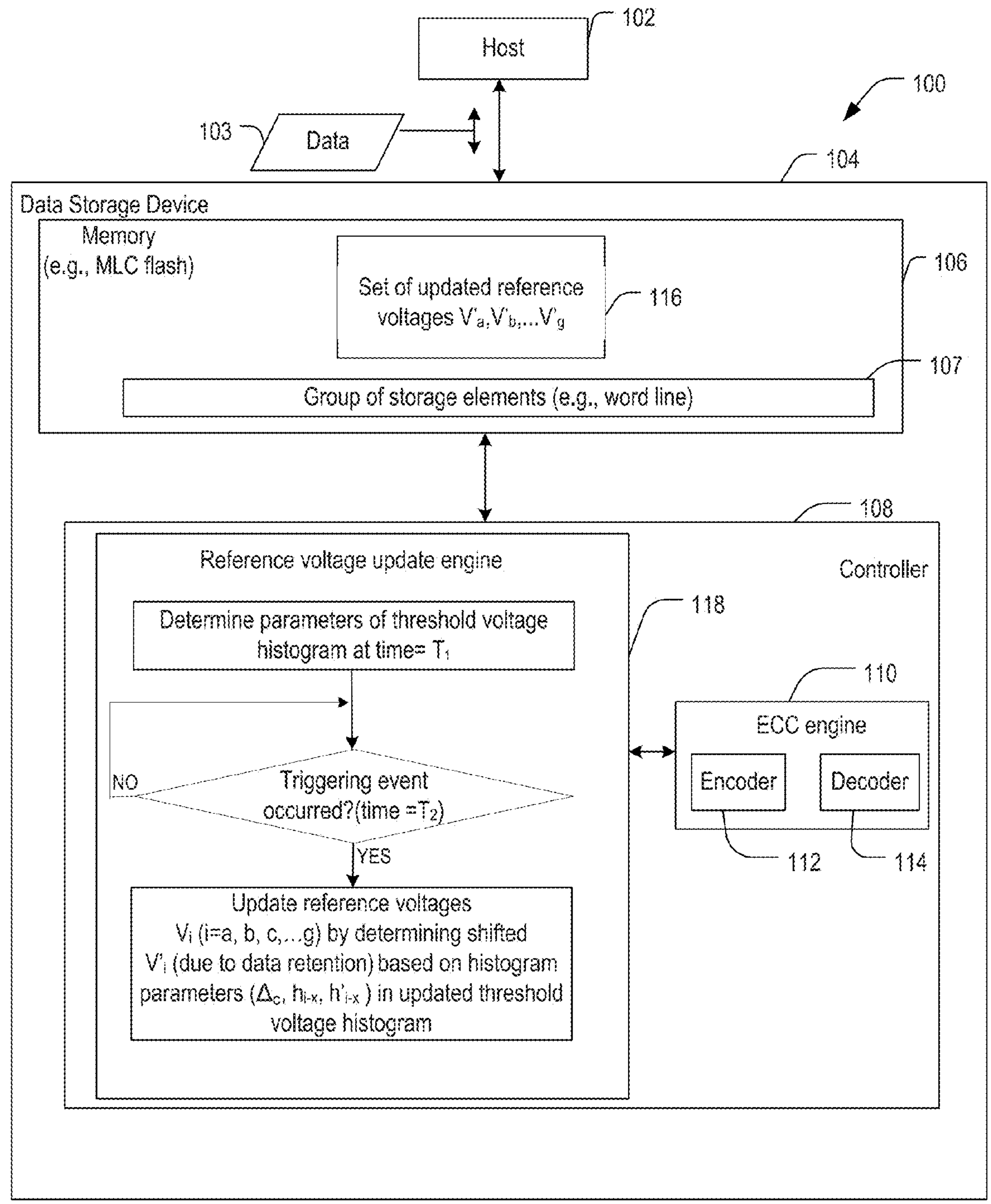
FIG. 1 is a general diagram of an illustrative embodiment of a system including a data storage device including a controller configured to update reference voltages by calculating a shift of threshold voltages.

Referring to FIG. 1, a particular illustrative embodiment of a system 100 includes a data storage device 104 that is configured to update reference voltages. The data storage device 104 includes a memory 106 coupled to a controller 108. The data storage device 104 is configured to enable exchange of data, such as data 103, between a host device 102 and the memory 106 of the data storage device 104.

The host device 102 may be configured to provide data to be stored at the memory 106 or to request data to be read from the memory 106. For example, the host device 102 may include a mobile telephone, a music or video player, a gaming console, an electronic book reader, a personal digital assistant (PDA), a computer such as a laptop computer, a notebook computer, or a tablet, any other electronic device, or any combination thereof.

The data storage device 104 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 104 may be embedded memory in the host device 102, such as eMMC® (trademark of JEDEC Solid State Technology Association, Arlington, Va.) memory and eSD memory, as illustrative examples.

The memory 106 may be a non-volatile memory of a flash device, such as a NAND flash device, a NOR flash device, or any other type of flash device. The memory 106 may include a group of storage elements 107. For example, the group of storage elements 107 may include a word line. Each storage element in the group of storage elements 107 may be a memory cell of a multi-level cell (MLC) memory.

Figure 2:
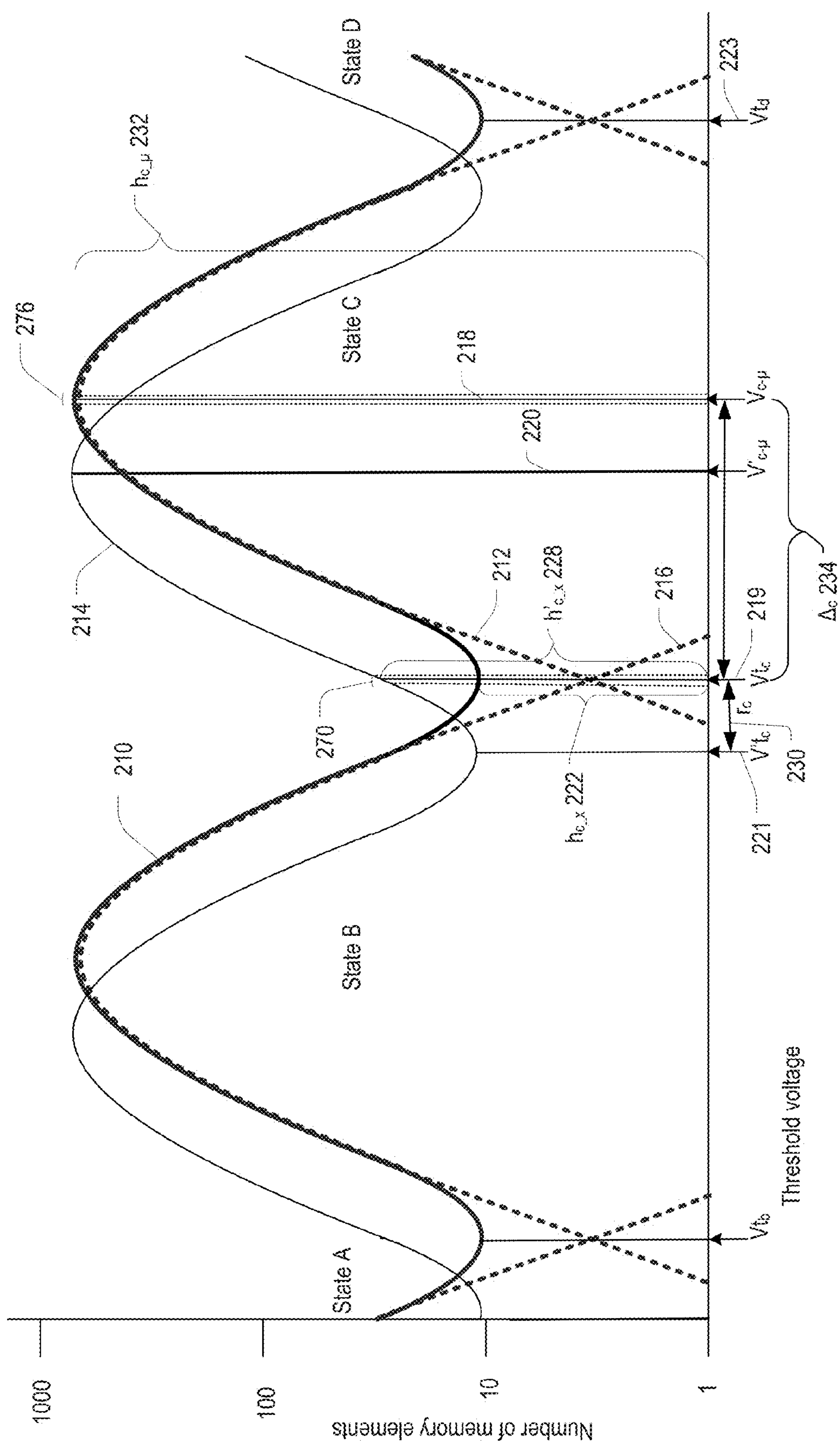
FIG. 2 depicts an illustrative embodiment of a histogram graph depicting a shift of threshold voltages of data storage elements.

Each storage element may have an associated threshold voltage corresponding to a state of the storage element. Each state may correspond to a particular range of threshold voltage values, such as illustrated in FIG. 2.

The state of each storage element represents data stored at the storage element, such as according to a mapping of bits to states of the storage element. The data stored at the storage element may be read by sensing the state of the storage element. For example, a state of a storage element may be read by applying one or more reference voltages of a set of reference voltages to the storage element to compare a threshold voltage of the storage element to the applied reference voltage(s). Each reference voltage can correspond to a border between adjacent states. To illustrate, a reference voltage $V_b$ may represent a voltage at a border between state A and state B. A set of the reference voltages ($Vt_a$, $Vt_b$, . . . $Vt_g$) may be stored in a portion 116 of the memory 106 and used to sense data stored in the storage elements.

The controller 108 may include an error correction code (ECC) engine 110. The ECC engine 110 may include an ECC encoder 112 and an ECC decoder 114. The ECC encoder 112 may be configured to encode data with error correction information, such as by generating parity bits corresponding to the data and combining the parity bits with the data to form an ECC codeword. The ECC decoder 114 may be configured to decode a representation of a codeword that is read from the memory 106 and correct errors in the data, up to an error correction capability of the ECC decoder 114.

The controller 108 includes a reference voltage update engine 118. Due to data retention effects over time, threshold voltages of the storage elements may shift, resulting in errors when storage elements programmed to a particular state are later sensed as being in another state. The reference voltage update engine 118 may be configured to determine updated reference voltages that enable reading of the stored data with a lower read error count as compared to reading the stored data using the non-updated reference voltages. For example, the reference voltage update engine 118 may include hardware logic, a processor configured to execute instructions, or a combination thereof, to determine threshold voltage shifts of storage elements and to generate updated reference voltages based on the determined threshold voltage shifts, such as described in further detail with respect to FIG. 2.

The reference voltage update engine 118 may be configured to generate the updated reference voltages based on a first count and a second count of storage elements that have threshold voltages within a voltage range that corresponds to a particular reference voltage. For example, the reference voltage update engine 118 may select the voltage range to correspond to a reference voltage, such as by sensing the group of storage elements 107 using the reference voltage $Vt_c$ and using an incremented voltage $Vt_c+\Delta V$ to determine a count of storage elements that have a threshold voltage in the range between $Vt_c$ and $Vt_c+\Delta V$. $\Delta V$ may be a small voltage increment relative to a voltage difference between states (e.g., $\Delta V$ is small compared to the voltage difference between $Vt_b$ and $Vt_c$).

The first count may be determined at a first time ($T_1$) when effects of data retention are expected to not result in errors to the stored data. For example, the first count may be determined upon storing data to the storage elements, or soon after storing the data. The first count may be stored in the non-volatile memory to be used during a reference voltage update operation. The first count and/or other parameters may be updated in response to one or more events. For example, the first count may be updated in response to every write operation to the group of storage elements 107, or in response to selected write operations to the group of storage elements 107, such as periodically (e.g., after every N write operations, where N is an integer greater than 1) and/or aperiodically (e.g., after a write operation following an indication that a number of read errors of data stored in the group of storage elements has exceeded a threshold but has not exceeded an error correction capacity of the ECC decoder 114. As another example, the first count may be updated in response to one or more of the reference voltages being updated, such as when the reference voltages are re-trained in response to a count of write/erase cycles exceeding a threshold value. Updating the first count may reset the first time ($T_1$) to indicate the most recent update of the first count. The second count of storage elements may be performed at a later time ($T_2$) after the first time, when effects of data retention may have caused errors to occur in the stored data.

The reference voltage update engine 118 may be configured to generate the updated reference voltages using the first count and the second count. For example, as described in further detail with respect to FIG. 2, the first count and the second count may be used to estimate curve parameters of a cell voltage distribution (CVD) curve corresponding to threshold voltages of the storage elements at the first time and a shifted version of the CVD curve corresponding to threshold voltages of the storage elements at the second time. An estimated shift of the CVD curve may be determined based on the curve parameters and the estimated shift may be applied as an offset to the corresponding reference voltage to generate one or more updated reference voltages.

During operation, the controller 108 may be configured to determine, at a time $T_1$ (e.g., an initial time), counts of storage elements having threshold voltages within specified ranges corresponding to reference voltages. For example, in a three bit per cell (3 BPC) implementation, the controller 108 may write data to the group of storage elements 107 by programming each storage element to one of eight distinct states: Erase, A, B, C, D, E, F, and G. A set of reference voltages $Vt_a$, $Vt_b$, $Vt_c$, $Vt_d$, $Vt_e$, $Vt_f$, and $Vt_g$ define boundaries between the states. Upon writing data to the group of storage elements 107, the controller 108 may measure first counts of the storage elements that have a threshold voltage within specified voltage ranges corresponding to the reference voltages. For example, the controller 108 may determine a count of storage elements having threshold voltages between $Vt_a$ and $Vt_a+\Delta V$, a count of storage elements having threshold voltages between $Vt_b$ and $Vt_b+\Delta V$, etc. The controller 108 may store the counts in the memory 106 for later retrieval and use by the threshold voltage update engine 118. The controller 108 may monitor memory operations to determine whether to update one or more of the counts and to determine whether a triggering event associated with data retention has occurred. To illustrate, the counts may be updated and the time $T_1$ may be reset in response to re-training the set of reference voltages (e.g., to at least partially compensate for write/erase cycling), in response to one or write events (periodic or aperiodic), in response to one or more other events, or any combination thereof. A triggering event associated with data retention may be a preset elapsed time from the first time (e.g., based on clock data received from the host device 102), a count of read errors, or another triggering event, occurring at a time $T_2$. As a particular example, the triggering event may correspond to an indication that a total read error count of data read from the group of storage elements 107 exceeds an error correction capacity of the ECC engine 110. To illustrate, when a representation of the data stored in the group of storage elements 107 has a number of errors that exceeds a correction capability of the decoder 114, the ECC engine 110 may send an indicator to the reference voltage update engine 118 that the representation of data has too many errors and is unrecoverable.

In response to determining that the triggering event has occurred, the reference voltage update engine 118 may cause the group of storage elements 107 to be sensed to determine second counts of the storage elements at each of the specified voltage ranges (e.g., a count of storage elements having threshold voltages in the range from $Vt_a$ to $Vt_a+\Delta V$, a count of storage elements having threshold voltages in the range from $Vt_b$ and $Vt_b+\Delta V$, etc.) Based on the first counts, the second counts, and one or more other parameter values, the threshold voltage update engine 118 may determine shift values for each of the reference voltages and may update the reference voltages based on the determined shift values.

After determining the updated reference voltages, the controller 108 may use the updated reference voltages to read data from the group of storage elements 107. The updated reference voltages result in fewer errors in the data by at least partially compensating for threshold voltage shifts of storage elements due to data retention. As a result, data that was unrecoverable by the ECC engine 110 due to too many errors when read using the non-updated reference voltages may be successfully decoded when read using the updated reference voltages. The updated reference voltages may be stored to the portion 116 of the memory 106 to be used in future reads of the group of storage elements 107.

An updated set of reference voltages may result in reduced errors associated with read data as compared to using reference voltages that are not updated based on threshold voltage shifts of storage elements. Reduced errors may result in a longer useful life of the data storage device 104. Additionally, the reduction in errors due to use of the updated set of reference voltages in reading the stored data may result in reduced processing at the ECC decoder 114, which may result in reduced read latency experienced by the host device 102.

FIG. 2 illustrates an example of updating a reference voltage based on histogram parameters, such as may be performed by the reference voltage update engine 118 of FIG. 1. A first histogram 210 (depicted as a smooth curve approximating histogram bin heights for simplicity of illustration) illustrates a distribution of threshold voltages of storage elements of the group of storage elements 107 of FIG. 1.

The first histogram 210 may be modeled as a sum of partially overlapping curves representing storage elements programmed to particular states. The curves may be approximated by a set of Gaussian functions. Each Gaussian function may represent a threshold voltage distribution of cells programmed to a particular state and may have the form of equation (1), where σ is a standard deviation, μ is a mean voltage, and $f(x)$ indicates a probability (or count) of cells having threshold voltage x.

$$f(x) = \frac{1}{\sigma\cdot\sqrt{2\pi}}\cdot e^{-\frac{(x-\mu)^2}{2\cdot\sigma^2}} \qquad \text{Equation (1)}$$

For example, a first Gaussian curve 212 represents a cell voltage distribution (CVD) of state C at a first time $T_1$ and a second Gaussian curve 216 represents a CVD of state B at the first time $T_1$. The sum of the CVDs at the first time $T_1$ (i.e., the first histogram 210) has multiple local maxima and has a local minimum at a crossover point of the curves 212 and 216 (i.e., at a voltage $Vt_c$ 219 where the CVD of state B intersects the CVD of state C). The local minimum at $Vt_c$ 219 represents a read threshold at the first time $T_1$.

A second histogram 214 represents threshold voltages of the storage elements at a later time $T_2$ and illustrates data retention effects. As shown in FIG. 2, the second histogram 214 is shifted left (i.e., in the direction of lower voltages) relative to the first histogram 210. The shift amount is denoted as $r_c$ 230 and is described in further detail below. The second histogram 214 has a shifted local minimum $V_{t_c}'$ 221 that represents a shifted read threshold, as described in further detail below.

Threshold voltages of storage elements in the memory 106 may shift due to the effects of cycling, program disturb, read disturb and data retention. Because program, erase, and read operations occur when the data storage device 104 is powered on, the controller 108 can keep track of a number of program/erase cycles and a number of reads, which may allow error correction such as diagnosis and repair to be performed for cycling, program disturb, and read disturb errors. Repair action can include moving data to a new page or to a new block of the memory 106 in case of program disturb and read disturb errors. Alternatively or in addition, repair action can include finding a new threshold voltage in case of cycling errors.

However, threshold voltage shifting that results in data retention errors can occur when the data storage device 104 is powered on and also when the data storage device 104 is powered off. If the data storage device 104 remains in a power off state for too long a period of time, accumulated data retention errors in a page of the memory 106 may become uncorrectable before they are diagnosed.

Data retention can occur at any cycle count (e.g., in a device with a low count of write/erase cycles or in an older device with a higher count of write/erase cycles). An adaptive read technique may be used to estimate an optimal or near-optimal movement of read points (i.e., reference voltages representing intersections of CVDs of adjacent states) due to data retention once effects due to cycling are accounted for. In illustrating such an adaptive read technique, a page or word line that undergoes an unknown amount of retention is presumed as having optimal read threshold voltages prior to the occurrence of the retention. For illustrative purposes, the group of storage elements 107 of FIG. 1 are described as being cells of a 3 bit per cell (3 BPC) multi-level-cell (MLC) NAND flash memory, and "optimal" read threshold voltages Vt (i.e., read threshold voltages at intersections of CVDs after correcting for program disturb, read disturb, and cycling effects) are denoted in equation (2) below. However, the technique may be applied to other types of memory, such as a single level cell (SLC) memory, a 2 BPC MLC memory, a 4 BPC MLC memory, or a different number of bits per cell.

In a 3 BPC implementation, each storage element of the group of storage elements 107 may be programmed into one of eight states, designated as an Erase state, state A, state B, state C, state D, state E, state F, and state G. Optimal read voltages Vt occur at crossover points between the CVDs of each of the states, denoted as:

$$Vt=\{Vt_a, Vt_b, Vt_c, Vt_d, Vt_e, Vt_f, Vt_g\} \qquad \text{Equation (2):}$$

where $Vt_a$ represents a voltage where the CVD of the Erase state intersects the CVD of state A, $Vt_b$ represents a voltage where the CVD of state A intersects the CVD of state B, $Vt_c$ represents a voltage where the CVD of state B intersects the CVD of state C, etc.

The adaptive read technique that may be applied by the reference voltage update engine 118 of FIG. 1 is explained with reference to the threshold voltage $Vt_c$ 219. While the adaptive read technique is explained with reference to the threshold voltage $Vt_c$ 219, similar calculations and assumptions apply to other read thresholds (e.g., $Vt_a$, $Vt_b$, $Vt_d$, $Vt_e$, $Vt_f$, and $Vt_g$, in a 3 BPC implementation). Although FIG. 2 illustrates the CVD of state B (i.e., the second Gaussian curve 216) and the CVD of state C (i.e., the first Gaussian curve 212), the adaptive read technique does not require the CVDs to be obtained. Instead, the following values may be obtained by the reference voltage update engine 118 at the time $T_1$, prior to occurrence of threshold voltage shifting of storage elements in the group of storage element 107 due to data retention:

$h_{c\_\mu}$ 232: The height of a bin 276 (e.g., a unit width bin of the first histogram 210) at the mean of the first Gaussian curve 212, corresponding to state C; and $h_{c\_x}$ 222: The height of a bin 270 (e.g., a unit width bin of the first histogram 210) at the cross-over of the second Gaussian curve 216 corresponding to state B and the first Gaussian curve corresponding to state C at time $T_1$ (i.e., at the threshold voltage $Vt_c$ 219).

For each unit width bin of the first histogram 210, a height of the bin represents the incremental increase in the number of active storage elements when the threshold voltage is incrementally increased. To illustrate, if a first count Y of storage elements (e.g., flash memory cells) are active when the storage elements are sensed with a first voltage V1 and a second count Z of storage elements are active when the storage elements are sensed with a second voltage V2, a height of a bin of the first histogram 210 that spans from V1 to V2 corresponds to Z-Y. A width of each bin of the first histogram 210 may be associated with a smallest voltage increment that can be applied by the controller 108 of FIG. 1. For example, a bin width may correspond to a few millivolts (mV); e.g., 1 unit=X mV, where X may be a parameter that may vary from application to application and/or from technology to technology.

When the group of storage elements 107 has recently been programmed, $h_{c\_x}$ 222 can be obtained at the cross-over of state B and state C. In an implementation where $Vt_c$ 219 is at a boundary between adjacent bins (rather than within the bin 270 as illustrated in FIG. 2), $h_{c\_x}$ 222 may be selected as the less-populated bin (i.e., lower height) of the two adjacent bins that border $Vt_c$ 219, as provided in equation (3).

$$h_{c\_x}=\min(\mathrm{bin}(V_{t_c}^{-}, V_{t_c}),\mathrm{bin}(V_{t_c}, V_{t_c}^{+})) \quad \text{Equation (3):}$$

In equation (3), $\mathrm{bin}(V_{t_c}^{-}, V_{t_c})$ represents the height of the bin of the first histogram 210 that has its right border at $Vt_c$, $\mathrm{bin}(V_{t_c}, V_{t_c}^{+})$ represents the height of the bin of the first histogram 210 that has its left border at $Vt_c$, and min (X, Y) represents a function that selects the lesser of two values X and Y.

Without generating the first histogram 210, the voltage corresponding to the mean of the first Gaussian curve 212 (i.e., a voltage corresponding to the peak of the first Gaussian curve 212) may be unknown by the read voltage update engine 118. However, a first order approximation of the height $h_{c\_\mu}$ 232 of the first Gaussian curve 212 can be determined at a voltage $V_{c\_\mu}$ 218 that is midway between the boundaries of state C (i.e., halfway between $V_{t_c}$ 218 and $V_{t_d}$ 223), according to Equations (4) and (5).

$$V_{c\_\mu} = \frac{V_{t_c} + V_{t_d}}{2} \quad \text{Equation (4)}$$

$$h_{c\_\mu}=\max(\mathrm{bin}(V_{t_{c-\mu}}^{-}, V_{t_{c-\mu}}),\mathrm{bin}(V_{t_{c-\mu}}, V_{t_{c-\mu}}^{+})) \quad \text{Equation (5):}$$

Also, a difference in $V_{c\_\mu}$ 218 and $V_{t_c}$ 219 may be denoted by $\Delta_c$ 234, according to Equation (6).

$$\Delta_c=V_{c\_\mu}-V_{t_c} \quad \text{Equation (6):}$$

Because $V_{c\_\mu}$ 218 approximates the mean of the first Gaussian curve 212, $h_{c\_x}$ 222 can be written in terms of $\sigma_c$ (the standard deviation for the first Gaussian curve 212 for state C) using equation (1), as denoted in equation (7).

$$\frac{h_{c\_x}}{2} = h_{c\_\mu} \cdot e^{-\frac{\Delta_c^2}{2\cdot\sigma_c^2}} \quad \text{Equation (7)}$$

It should be noted that, at $Vt_c$ 219, the height of the first histogram 210 ($h_{c\_x}$ 222) is the sum of equal contributions $$\frac{h_{c\_x}}{2}$$

from state C and from state B, so that $$\frac{h_{c\_x}}{2}$$

of Equation (7) is the contribution from state C and the other $$\frac{h_{c\_x}}{2}$$

is contributed by state B.

The only unknown in equation (7) is $\sigma_c$, which can be written as $$\sigma_c = \sqrt{\frac{\Delta_c^2}{2\cdot\ln\frac{2\cdot h_{c\_\mu}}{h_{c\_x}}}} \quad \text{Equation (8)}$$

As explained above, retention causes the optimal read thresholds to move by an unknown amount. If the amount of retention exceeds a certain amount and the thresholds are not adjusted to account for the retention, the data read from the memory 106 may become uncorrectable. The unidentified optimal thresholds (the cross-over Vt values) after retention may be denoted by $V_t'$.

$$V_t'=\{V_{t_a}', V_{t_b}', V_{t_c}', V_{t_d}', V_{t_e}', V_{t_f}', V_{t_g}'\} \quad \text{Equation (9):}$$

A voltage shift to adjust $Vt_c$ 219 to obtain $V_{t_c}'$ 221 is denoted as $r_c$ 230.

$$r_c=V_{t_c}'-V_{t_c} \quad \text{Equation (10):}$$

When implementing the adaptive read technique, a particular value $h_{c\_x}'$ 228, the height of the unit bin 270 at $Vt_c$ 219 after retention (i.e., the height of the second histogram 214 at $Vt_c$ 219 at the second time $T_2$), may be obtained by the reference voltage update engine 118 in response to data read from the group 107 of storage elements becoming uncorrectable due to retention. The unit bin 270 for determining $h_{c\_x}'$ 228 is the same unit bin 270 for determining $h_{c\_x}$ 222, with $h_{c\_x}$ 222 being obtained from the group of storage elements 107 before retention (e.g., at time $T_1$) and $h_{c\_x}'$ 228 being obtained from the group of storage elements 107 after retention (e.g., at time $T_2$).

$V_{c\_\mu}'$ 220 is the voltage representing the shifted mean for state C at time $T_2$. The following equations represent relationships between $V_{c\_\mu}'$ 220, $h_{c\_x}$ 222, and $h_{c\_x}'$ 228. It should be noted that the following equations are only an approximation, as they do not account for a potential change in $\sigma_c$ due to retention.

$$V_{c\_\mu}'=V_{t_c}'+\Delta_c \quad \text{Equation (11):}$$

$$h_{c\_x}' = h_{c\_\mu} \cdot e^{-\frac{(V_{t_c}-V_{c\_\mu}')^2}{2\cdot\sigma_c^2}} \quad \text{Equation (12)}$$

$$\frac{h_{c\_x}}{2} = h_{c\_\mu} \cdot e^{-\frac{(V_{t_c}'-V_{c\_\mu}')^2}{2\cdot\sigma_c^2}} \quad \text{Equation (13)}$$

Equation (14) may be obtained from equations (8), (11), (12) and (13):

$$\Delta_c^2 - (V_{t_c} - V'_{c\_\mu})^2 = \Delta_c^2 \cdot \frac{\ln\left(\frac{2 \cdot h'_{c\_x}}{h_{c\_x}}\right)}{\ln\left(\frac{2 \cdot h_{c\_\mu}}{h_{c\_x}}\right)} \quad \text{Equation (14)}$$

$$(V_{t_c} - V'_{c\_\mu}) = \Delta_c \cdot \sqrt{\left(1 - \frac{\ln\left(\frac{2 \cdot h'_{c\_x}}{h_{c\_x}}\right)}{\ln\left(\frac{2 \cdot h_{c\_\mu}}{h_{c\_x}}\right)}\right)} \quad \text{Equation (15)}$$

Substituting equations (10) & (11) into equation (15) results in an expression for $r_c$ 230:

$$r_c = \Delta_c \cdot \left(-1 + \left(1 - \frac{\ln\left(\frac{2 \cdot h'_{c\_x}}{h_{c\_x}}\right)}{\ln\left(\frac{2 \cdot h_{c\_\mu}}{h_{c\_x}}\right)}\right)^{\frac{1}{2}}\right) \quad \text{Equation (16)}$$

Consider the Taylor series expansion (for a value |kx|<<1) given in equation (17):

$$(1 + kx)^n = 1 + (n)(kx) + \frac{n(n-1)}{2!}(kx)^2 + \frac{n(n-1)(n-2)}{3!}(kx)^3 + \ldots \quad \text{Eq. (17)}$$

Assuming k=−1, n=1/2 and $$x = \frac{\ln\left(\frac{2 \cdot h'_{c\_x}}{h_{c\_x}}\right)}{\ln\left(\frac{2 \cdot h_{c\_\mu}}{h_{c\_x}}\right)},$$

equation (16) can be approximated as (ignoring the terms with degree of x higher than 3, because x<<1):

$$r_c = -\frac{\Delta_c}{8}(4x + x^2) \quad \text{Equation (18)}$$

Equation 18 represents an approximation of the shift amount $r_c$ 230 due to data retention and is based on two measurements made prior to the data retention (e.g., bin height at $Vt_c$ 219 ($h_{c\_x}$ 222) and bin height at the estimated peak $V_{c\text{-}\mu}$ 218 ($h_{c\_\mu}$ 232), at time $T_1$) and one measurement made after the data retention (e.g., bin height at $Vt_c$ 219 ($h_{c\_x}$' 228), at time $T_2$). As a result, a relatively small amount of measurement data may be stored upon programming data to the memory 106, such as a peak height and a crossover height (e.g., of the first histogram 210) for each state (Erase, A, B, C, D, E, F, and G) after programming data to a block of a flash memory. The measurement data may be retrieved upon occurrence of a triggering event and used in accordance with equation (16) or (18) to determine a shift of each state to generate updated reference voltages after data retention.

Determining updated reference voltages (e.g., the updated reference voltages $Vt'_a$, $Vt'_g$ from histogram parameters) may result in reduced calculation time as compared with other methods, such as methods that measure and analyze the entire second histogram 214 to locate local minima, which may result in reduced read latency experienced by the host device 102.

Figure 3:
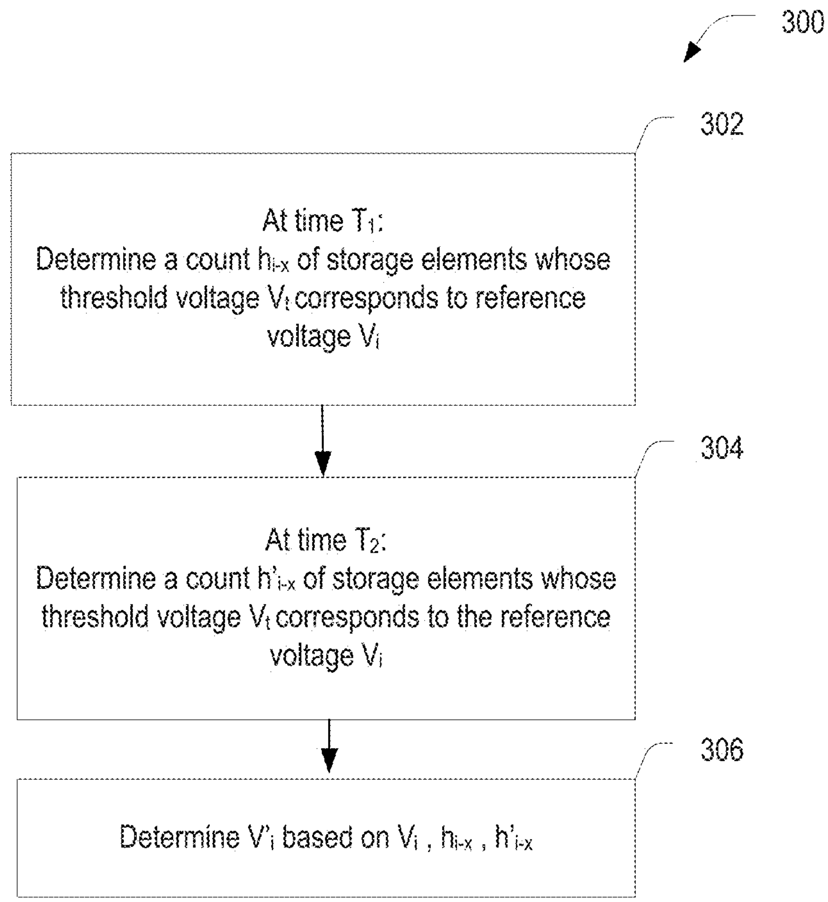
FIG. 3 is a flow diagram illustrating a particular embodiment of a method of updating reference voltages.

Referring to FIG. 3, a flowchart of an illustrative embodiment of a method 300 of updating reference voltages based on parameters of a threshold voltage histogram is illustrated. The method 300 may be applied by the data storage device 104 of FIG. 1. The method 300 may include, at a first time, determining a first count of storage elements having threshold voltages within a voltage range that corresponds to a first reference voltage, at 302. The first count may be determined for the first reference voltage (e.g., $Vt_c$) by sensing the storage elements using a first voltage (e.g., $Vt_c$) and a second voltage (e.g., $Vt_c+\Delta V$). The first count corresponds to the difference in the number of storage elements that are activated when sensed using the first voltage as compared to using the second voltage. As another example, referring to FIG. 2, the first histogram 210 includes a plurality of bins, each bin representing an incremental voltage range. The first reference voltage may be the reference voltage $Vt_c$ 219 of FIG. 2, the voltage range may correspond to the voltage bin 270 of FIG. 2, and the first count of storage elements may correspond to $h_{c\_x}$ 222 of FIG. 2 (i.e., the height of the unit width bin 270 at the crossover of state B and state C). The first count may be determined immediately or soon after storing data to the storage elements and prior to data retention effects causing errors to occur in the stored data.

The first count and/or other parameters may be updated in response to one or more events. For example, $h_{c\_x}$ 222 and $h_{c\_\mu}$ 232 of FIG. 2 may be updated in response to every write operation to the group of storage elements 107, or in response to selected write operations to the group of storage elements 107, such as periodically (e.g., after every N write operations, where N is an integer greater than 1) and/or aperiodically (e.g., after a write operation following an indication that a number of read errors of data stored in the storage elements has exceeded a threshold but has not exceeded an ECC correction capability). As another example, $h_{c\_x}$ 222, $h_{c\_\mu}$ 232, and $\Delta_c$ 234 of FIG. 2 may be updated in response to one or more of the reference voltages being updated, such as when the reference voltages are re-trained in response to a count of write/erase cycles exceeding a threshold value. Updating the first count may reset the first time ($T_1$) to indicate the most recent update of the first count.

The method 300 may further include, at a second time, determining a second count of storage elements having threshold voltages within the voltage range, at 304. For example, the second time may be associated with an indication that a total read error count associated with reading data from the storage elements exceeds an error correction capability of the error correction code (ECC) engine 110 of FIG. 1. For example, the ECC engine 110 may send an indication to the threshold voltage update engine 118 that data read from the group of storage elements 107 is unrecoverable due to too many errors occurring in the data. The voltage range may correspond to the voltage bin 270 of FIG. 2, and the second count of storage elements may correspond to $h_{c\_x}$' 228 of FIG. 2 (i.e., the height of the unit bin 270 at $Vt_c$ 219 after retention).

The method 300 may further include calculating an updated first reference voltage at least partially based on the first reference voltage, the first count, and the second count, at 306. For example, the updated first reference voltage may be the reference voltage $V_{t_c}$' 221 of FIG. 2, which may be determined at least in part based on an estimated shift (e.g., $r_c$ 230) of a threshold voltage of a group of cells originally programmed to a particular state, as further described with reference to FIG. 4. The estimated shift $r_c$ 230 may be calculated based on equation (16) or the Taylor series approximation shown in equation (18). As illustrated in FIG. 2, the updated reference voltage $V_{t_c}$' 221 may be calculated as $V_{t_c}$ 219–$r_c$ 230.

Determining updated reference voltages from histogram parameters based on an estimated mean or average shift of threshold voltages of storage elements originally programmed to a particular state may result in reduced calculation time as compared with other calculation methods. Generating updated reference voltages with reduced calculation time as compared to other methods may result in reduced read latency of a device accessing the memory, such as the host device 102.

Figure 4:
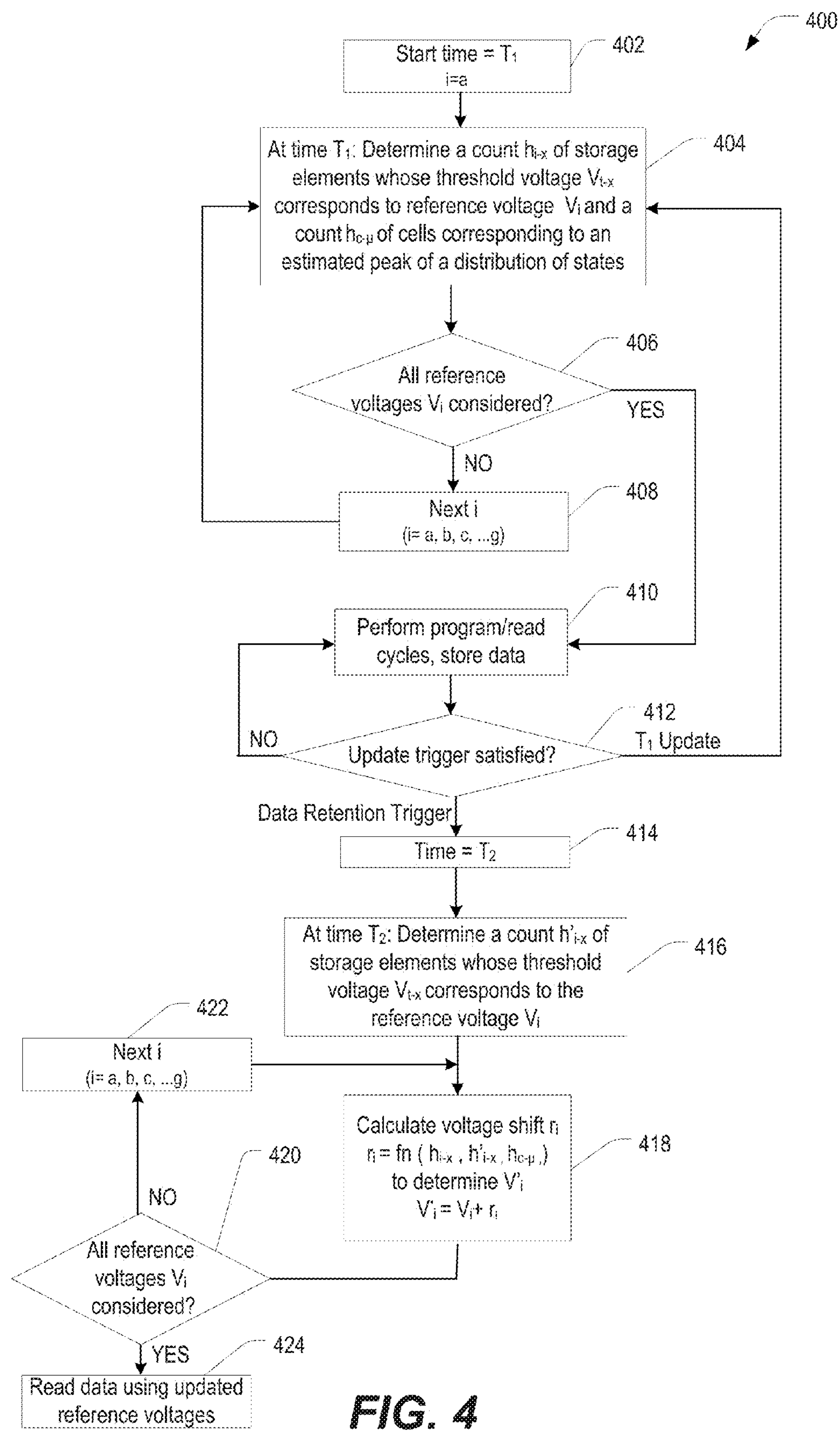
FIG. 4 is a flow diagram illustrating another particular embodiment of a method of updating reference voltages.

Referring to FIG. 4, a flowchart of another illustrative embodiment of a method 400 of updating reference voltages based on parameters of a threshold voltage histogram is illustrated. The method 400 may be applied by the data storage device 104 of FIG. 1.

At a first time, a first reference voltage may be selected, at 402. For example, the state of a storage element may be state C as illustrated in FIG. 2. At the first time, a first count of storage elements having threshold voltages within a voltage range that corresponds to a first reference voltage and a count of cells corresponding to an estimated peak of a distribution of states may be determined, at 404. For example, referring to FIG. 2, the first reference voltage may be the reference voltage $Vt_c$ 219 of FIG. 2, the voltage range may correspond to the voltage bin 270 of FIG. 2, and the first count of storage elements may correspond to $h_{c\_x}$ 222 of FIG. 2 (i.e., the height of the first histogram 210 at the unit width bin 270 at the cross-over of state B and state C). In addition, at the first time, a count of mid-state storage elements may be determined. For example, the count of mid-state storage elements may correspond to $h_{c\_\mu}$ 232 of FIG. 2. The mid-state storage elements may have threshold values within another voltage range corresponding to a central portion of a range of threshold voltages of a first data storage state (e.g., the state C). For example, the other voltage range may correspond to the voltage bin 276 of FIG. 2. The first reference voltage $Vt_c$ 219 of FIG. 2 may correspond to a boundary between the first data storage state (i.e., the state C) and a second data storage state (i.e., the state B).

A determination may be made whether all reference voltages have been considered, at 406. For example, stored data may be read from the storage elements using a plurality of reference voltages, such as the reference voltages $V_t$ of equation (2). Multiple or all of the reference voltages $V_t$ may be tracked and adjusted for data retention correction. If a determination is made that all reference voltages have not been considered, then a next reference voltage of the plurality of reference voltages is considered at 408, and thereafter processing flow reverts to 404. If a determination is made that all reference voltages have been considered, then processing flow proceeds to 410.

Program read/erase cycles are performed, and data is stored during normal operation of the memory, at 410. For example, data stored at the storage elements may be read by comparing a threshold voltage of the storage element to one or more reference voltages of a set of reference voltages, such as the reference voltages ($Vt_a$, $Vt_b$, . . . $Vt_g$) that are stored in the portion 116 of the memory 106 of FIG. 1.

A determination may be made whether an update triggering event has occurred, at 412. An update triggering event may correspond to an event that results in an update of $T_1$ and parameters corresponding to $T_1$, such as in response to a write operation to the group of storage elements 107 (e.g., periodically and/or aperiodically) or in response to one or more of the reference voltages being updated, such as when the reference voltages are re-trained in response to a count of write/erase cycles exceeding a threshold value. In response to a triggering event corresponding to $T_1$, processing returns to 404, where $T_1$ is reset and corresponding parameters (e.g., $h_{c\_x}$ 222, $h_{c\_\mu}$ 232, and $\Delta_c$ 234 of FIG. 2) are updated. Alternatively, an updated triggering event may correspond to a data retention triggering event. For example, the controller 108 of FIG. 1 may monitor whether a particular elapsed time, a count of read errors exceeding an error correction capability of an ECC decoder, or another triggering event associated with data retention has occurred. If an update triggering event has not occurred, processing flow reverts to 410.

If an update triggering event corresponding to data retention has occurred, then a second time associated with the triggering event is noted at 414. For example, the second time may indicate a preset elapsed time from the first time. As another example, the second time may be associated with a power-on event of the data storage device 104. At the second time, a second count of storage elements having threshold voltages within the voltage range may be determined, at 416. The second count may be determined by performing a first sense operation and a second sense operation of the storage elements using different voltages (e.g., $Vt_c$ and $Vt_c+\Delta V$) and determining a difference between the number of storage elements that are activated in the first sense operation as compared to the number of storage elements that are activated in the second sense operation. For example, the voltage range may correspond to the voltage bin 270 of FIG. 2, and the second count of storage elements may correspond to $h_{c\_x}$' 228 of FIG. 2 (i.e., the height of second histogram 214 at the unit bin 270 (e.g., at $Vt_c$ 219) after retention).

An updated first reference voltage based on the first reference voltage, the first count, and the second count may be calculated, at 418. For example, the updated first reference voltage may be the reference voltage $V_{t_c}$' 221 of FIG. 2. Calculating the updated first reference voltage may correspond to determining a shift of an estimated distribution of threshold voltages of storage elements programmed to the first data storage state and determining the updated first reference voltage by applying the shift to the first reference voltage. For example, the estimated distribution of threshold voltages may correspond to the first Gaussian curve 212 having a mean and a standard deviation. The mean at the first time may correspond to a voltage within the other voltage range (e.g., the voltage range that corresponds to the voltage bin 276 of FIG. 2). The count of mid-state storage elements may correspond to a height of the first Gaussian curve 212 at the mean (e.g., $h_{c\_\mu}$ 232 of FIG. 2). The first count (e.g., corresponding to $h_{c\_x}$ 222 of FIG. 2) may correspond to twice a height of the first Gaussian curve 212 at a particular distance from the mean. For example, the height of the first histogram 210 at the cross-over of state B and state C is twice the height of the first Gaussian curve 212 and the second Gaussian curve 216 at the cross-over of state B and state C.

The updated first reference voltage $V_{t_c}$' 221 of FIG. 2 may be calculated based on shifting the mean without modifying the standard deviation. For example, the updated first reference voltage $V_{t_c}$' 221 may be calculated by applying the estimated shift (e.g., $r_c$ 230) to the first reference voltage $Vt_c$ 219 of FIG. 2. The estimated shift $r_c$ 230 may be calculated based on equation (16) or the Taylor series approximation shown in equation (18). After determining the updated first reference voltage $V_{t_c}$' 221, the first reference voltage $Vt_c$ 219 may be replaced in the plurality of reference voltages by the updated first reference voltage $V_{t_c}$' 221.

A determination may be made whether all reference voltages have been considered, at 420. Multiple updated reference voltages corresponding to the plurality of reference voltages may be determined in a manner similar to that described for determining the updated first reference voltage $V_{t_c}'$ 221 of FIG. 2. If a determination is made that all reference voltages have not been considered, then a next reference voltage is considered at 422, and thereafter the method flow reverts to 416. If a determination is made that all reference voltages have been considered, then data may be read using the updated reference voltages, at 424. For example, the updated reference voltages may be stored at the portion 116 of the memory 106 of FIG. 1 to replace the non-updated reference voltages and used by the controller 108 to read data from the group of storage elements 107.

Improved error correction capability of data stored in a memory of a data storage device may be achieved by determining updated reference voltages from histogram parameters and updating reference voltage values based on an estimated shift of a threshold voltage distribution of a group of storage elements originally programmed to a particular state.

Although various components depicted herein are illustrated as block components and described in general terms, such components may include one or more microprocessors, state machines, or other circuits configured to enable a data storage device, such as the data storage device 104 of FIG. 1, to perform the particular functions attributed to such components. For example, the reference voltage update engine 118 of FIG. 1 may represent physical components, such as controllers, processors, state machines, logic circuits, or other structures to create an updated set of reference voltages.

In a particular embodiment, the data storage device 104 may be a portable device configured to be selectively coupled to one or more external devices. For example, the data storage device 104 may be a removable device such as a universal serial bus (USB) flash drive or a removable memory card. However, in other embodiments, the data storage device 104 may be attached or embedded within one or more host devices, such as within a housing of a portable communication device. For example, the data storage device 104 may be within a packaged apparatus, such as a wireless telephone, a personal digital assistant (PDA), a gaming device or console, a portable navigation device, a computer, or other device that uses internal non-volatile memory. In a particular embodiment, the data storage device 104 includes a non-volatile memory, such as a Flash memory (e.g., NAND, NOR, Multi-Level Cell (MLC), Divided bit-line NOR (DINOR), AND, high capacitive coupling ratio (HiCR), asymmetrical contactless transistor (ACT), or other Flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A data storage device comprising:

a non-volatile memory including storage elements; and a controller configured to:

at a first time, determine a first count of the storage elements of the non-volatile memory having threshold voltages within a voltage range that corresponds to a first reference voltage;

at a second time, determine a second count of the storage elements having threshold voltages within the voltage range; and determine an updated first reference voltage based on a determined ratio corresponding to $h'_{c\_x}/h_{c\_x}$, wherein $h'_{c\_x}$ corresponds to the second count, and wherein $h_{c\_x}$ corresponds to the first count.

2. The data storage device of claim 1, wherein the second time is associated with a read operation in which data is read from the storage elements, and wherein a number of errors in the data exceeds an error correction capability of an error correction code (ECC) engine.

3. The data storage device of claim 1, wherein the controller is further configured, at the first time, to determine a count of mid-state storage elements, the mid-state storage elements having threshold values within a second voltage range corresponding to a central portion of a range of threshold voltages of a first data storage state, and wherein the first reference voltage corresponds to a boundary between the first data storage state and a second data storage state.

4. The data storage device of claim 3, wherein the controller is further configured to determine a shift of an estimated distribution of threshold voltages of the storage elements programmed to the first data storage state and to determine the updated first reference voltage by applying the shift to the first reference voltage.

5. The data storage device of claim 4, wherein the estimated distribution of threshold voltages corresponds to a Gaussian distribution having a mean and a standard deviation, wherein the mean at the first time corresponds to a voltage within the second voltage range, wherein the count of mid-state storage elements corresponds to a value of the Gaussian distribution at the mean, wherein the first count corresponds to twice a value of the Gaussian distribution at a particular distance from the mean, and wherein the controller is further configured to determine the updated first reference voltage based on shifting the mean without modifying the standard deviation.

6. The data storage device of claim 1, wherein stored data is readable from the storage elements using a plurality of reference voltages including the first reference voltage, and wherein the controller is further configured to determine multiple updated reference voltages corresponding to the plurality of reference voltages, the multiple updated reference voltages including the updated first reference voltage.

7. The data storage device of claim 1, wherein the second time corresponds to a preset elapsed time from the first time.

8. The data storage device of claim 1, wherein the second time is associated with a reboot of the data storage device.

9. The data storage device of claim 1, wherein the controller is further configured, after determining the updated first reference voltage, to replace the first reference voltage in a plurality of reference voltages by the updated first reference voltage.

10. The data storage device of claim 1, wherein the non-volatile memory includes a flash memory.

11. A device comprising a non-volatile memory and instructions that when executed by a processor cause the processor to determine at a first time a first count of storage elements of the non-volatile memory having threshold voltages within a voltage range that corresponds to a first reference voltage, determine at a second time a second count of storage elements having threshold voltages within the voltage range, and determine an updated first reference voltage based on a determined ratio corresponding to $h'_{c\_x}/h_{c\_x}$, wherein $h'_{c\_x}$ corresponds to the second count, and wherein $h_{c\_x}$ corresponds to the first count.

12. The device of claim 11, further comprising a controller that includes the processor, wherein the non-volatile memory comprises a multi-level cell (MLC) non-volatile memory coupled to the controller, and wherein the controller and the MLC non-volatile memory are integrated into a flash memory card, a universal serial bus (USB) flash drive, a solid state drive (SSD), or an embedded flash memory.

13. A method comprising:

in a data storage device that includes storage elements of a non-volatile memory, performing:

at a first time, determining a first count of the storage elements having threshold voltages within a voltage range that corresponds to a first reference voltage;

at a second time, determining a second count of the storage elements having threshold voltages within the voltage range; and determining an updated first reference voltage based on a determined ratio corresponding to $h'_{c\_x}/h_{c\_x}$, wherein $h'_{c\_x}$ corresponds to the second count, and wherein $h_{c\_x}$ corresponds to the first count.

14. The method of claim 13, wherein the second time is associated with a total read error count associated with reading data from the storage elements exceeding an error correction capability of an error correction code (ECC) engine.

15. The method of claim 13, further comprising, at the first time, determining a count of storage elements having threshold values within a second voltage range, the second voltage range corresponding to a center of a range of threshold voltages of a first data storage state, wherein the first reference voltage corresponds to a boundary between the first data storage state and a second data storage state.

16. The method of claim 15, wherein determining the updated first reference voltage includes determining a shift of an estimated distribution of threshold voltages of the storage elements programmed to the first data storage state and determining the updated first reference voltage by applying the shift to the first reference voltage.

17. The method of claim 16, wherein the estimated distribution of threshold voltages corresponds to a Gaussian distribution having a mean and a standard deviation, wherein the mean at the first time corresponds to a voltage within the second voltage range, wherein the count of mid-state storage elements corresponds to a height of the Gaussian distribution at the mean, wherein the first count corresponds to twice the height of the Gaussian distribution at a particular distance from the mean, and wherein determining the updated first reference voltage is based on shifting the mean without modifying the standard deviation.

18. The method of claim 13, wherein data is read from a group of the storage elements of the non-volatile memory using a plurality of reference voltages including the first reference voltage, and further comprising determining multiple updated reference voltages corresponding to the plurality of reference voltages, the multiple updated reference voltages including the updated first reference voltage.

19. The method of claim 13, wherein the second time corresponds to a preset elapsed time from the first time.

20. The method of claim 13, wherein the second time is associated with a reboot of a device that utilizes the storage elements.

21. The method of claim 13, further comprising after determining the updated first reference voltage, replacing the first reference voltage by the updated first reference voltage.

22. The method of claim 13, further comprising, after the first time and prior to the second time, updating the first count in response to at least one of a write operation or a reference voltage update operation.

23. The method of claim 13, wherein the first count and the second count correspond to a first histogram curve and a second, shifted histogram curve, the first histogram curve and the second, shifted histogram curve corresponding to distributions of threshold voltages of the storage elements at the first time and at the second time, respectively, and further comprising: determining a relative shift between the first histogram curve and the second, shifted histogram curve based on the determined ratio, and determining the updated first reference voltage by applying the relative shift to the first reference voltage.

* * * * *